United States Patent
Yamaguchi (10) Patent No.: US 10,622,286 B2
(45) Date of Patent: Apr. 14, 2020

(54) LEAD FRAME AND METHOD FOR MANUFACTURING THE SAME

(71) Applicant: OHKUCHI MATERIALS CO., LTD., Kagoshima (JP)

(72) Inventor: Masaki Yamaguchi, Kagoshima (JP)

(73) Assignee: OHKUCHI MATERIALS CO., LTD., Kagoshima (JP)

( * ) Notice: Subject to any disclaimer, the term of this patent is extended or adjusted under 35 U.S.C. 154(b) by 0 days.

(21) Appl. No.: 15/873,226

(22) Filed: Jan. 17, 2018

(65) Prior Publication Data

US 2018/0204787 A1  Jul. 19, 2018

(30) Foreign Application Priority Data

Jan. 17, 2017  (JP) .................................. 2017-006178

(51) Int. Cl.
*H01L 23/495* (2006.01)
*H01L 23/00* (2006.01)
*H01L 21/48* (2006.01)

(52) U.S. Cl.
CPC .... *H01L 23/49541* (2013.01); *H01L 21/4828* (2013.01); *H01L 21/4832* (2013.01); *H01L 23/49582* (2013.01); *H01L 24/29* (2013.01); *H01L 24/32* (2013.01); *H01L 24/45* (2013.01); *H01L 24/48* (2013.01); *H01L 24/73* (2013.01); *H01L 24/92* (2013.01); *H01L 2224/29139* (2013.01); *H01L 2224/32245* (2013.01); *H01L 2224/45144* (2013.01); *H01L 2224/45147* (2013.01); *H01L 2224/48247* (2013.01); *H01L 2224/73265* (2013.01); *H01L 2224/92247* (2013.01); *H01L 2224/97* (2013.01)

(58) Field of Classification Search
CPC ........ H01L 23/495; H01L 21/48; H01L 23/00
USPC .......................................... 257/676; 438/127
See application file for complete search history.

(56) References Cited

U.S. PATENT DOCUMENTS

| | | | |
|---|---|---|---|
| 2004/0080025 A1* | 4/2004 | Kasahara | H01L 21/4821 257/666 |
| 2007/0042585 A1* | 2/2007 | Sakai | H01L 21/4828 438/592 |
| 2009/0294932 A1* | 12/2009 | Sahasrabudhe | H01L 23/49503 257/666 |
| 2009/0309201 A1* | 12/2009 | Morita | H01L 23/49503 257/676 |

(Continued)

FOREIGN PATENT DOCUMENTS

| | | |
|---|---|---|
| JP | 2001-24135 | 1/2001 |
| JP | 2009-164232 | 7/2009 |

(Continued)

*Primary Examiner* — Sheng-Bai Zhu
(74) *Attorney, Agent, or Firm* — Wenderoth, Lind & Ponack, L.L.P.

(57) ABSTRACT

A lead frame has a concavity formed on the upper-surface side of a metal plate and columnar portions defined by the concavity. A horizontally deepest portion regarding a side face shape of the concavity is positioned lower than the vertical center position of the concavity. Thereby, overhangs projecting from the top faces of the columnar portions rarely cause shape defects or burr defects and thus the lead frame has an enhanced capability, by the columnar portions, of preventing a sealing resin from coming off without sacrificing the freedom of wiring design.

5 Claims, 5 Drawing Sheets (56) References Cited

U.S. PATENT DOCUMENTS

| | | | | |
|---|---|---|---|---|
| 2010/0301465 A1* | 12/2010 | Shoji | ............ | H01L 21/4832 |
| | | | | 257/676 |
| 2011/0201159 A1* | 8/2011 | Mori | ............ | H01L 21/4832 |
| | | | | 438/123 |
| 2017/0162520 A1* | 6/2017 | Kaneko | ............ | H01L 23/49548 |

FOREIGN PATENT DOCUMENTS

| | | |
|---|---|---|
| JP | 2012-146782 | 8/2012 |
| JP | 5626785 | 10/2014 |

* cited by examiner

LEAD FRAME AND METHOD FOR MANUFACTURING THE SAME

CROSS-REFERENCE TO RELATED PATENT APPLICATIONS

This application claims the benefit of Japanese Patent Application No. 2017-6178 filed in Japan on Jan. 17, 2017, the contents of which are incorporated herein by reference.

BACKGROUND OF THE INVENTION

1) Field of the Invention

The present invention relates to a lead frame having a concavity for defining columnar portions, which are to serve as internal connecting terminals, respectively, or as internal connecting terminals and pads, respectively, and a method for manufacturing the same.

2) Description of Related Art

Downsizing of semiconductor devices (packages) is being forwarded mainly for application to mobile devices. For this reason, various CSPs (Chip Scale Packages) are on the market. Among these, a semiconductor device manufactured upon use of a lead frame described in Japanese Patent Application Laid-Open (KOKAI) No. 2001-24135 is expected as an alternative to FBBGA (Fine Pitch Ball Grid Array), for it is simple in structure, allows to be reduced in cost, and is modifiable to be multi-pin type.

According to the lead frame described in JP KOKAI No. 2001-24135 and the method for manufacturing a semiconductor device using the same, a copper material for lead frame is mainly used as a metal material, and internal connecting terminals on one side (front-surface side) thereof and external connecting terminals on the other side (back-surface side) thereof are subjected to plating. After that, upon a mask made of resist being formed on the entire surface on the back-surface side and the plating layer as formed being used as an etching mask on the front-surface side, half-etching is performed for a predetermined depth from the front-surface side, to complete a lead frame in which the internal connecting terminals and the pads are defined by the concavity.

Then, semiconductor elements are mounted on the pads of the completed lead frame, and after electrodes of the semiconductor elements and the internal connecting terminals of the lead frame are connected by bonding wires, the semiconductor elements, the bonding wires etc. are sealed with epoxy resin or the like.

Then, the copper material is etched upon use of, as an etching mask, the plating layer that was formed as external connecting terminal surfaces, so that the individual semiconductor-element mounting portions (pads) and the terminal portions (the internal connecting terminals and the external connecting terminals) are electrically isolated. Finally, the entirety is cut into package-size pieces, to complete individual packages.

According to the lead frame described in JP KOKAI No. 2001-24135 and the method for manufacturing a semiconductor device using the same, since, up to the resin-sealing, the individual terminal portions (internal connecting terminals and external connecting terminals) are connected together via the remainder of the copper material at the sites having been subjected to the half-etching and the remainder of the copper material at the sites having been subjected to the half-etching is to be removed by etching after the resin-sealing, the individual external connecting terminals are not needed to be coupled to the outer frame. Therefore, a support portion as in the conventional lead frame is unnecessary and the degree of freedom of design increases; for example, it is possible to arrange the external connecting terminals in two or more rows, or it is possible to make a multi-pin type with a small package size.

Also, as a technique similar to the lead frame described in JP KOKAI No. 2001-24135 and the method for manufacturing a semiconductor device using the same, Japanese Patent Application Laid-Open (KOKAI) No. 2009-164232 discloses, in consideration of problems in the case where the same plating layer is formed on the front and back surfaces that a noble metal plating layer such as Au should be formed on the back surface also in view of bonding to raise the cost and that etching treatment exposes metal faces (copper faces) to cause oxidation, the technique of forming, on the side of the back surface as an external connecting terminal surface, inexpensive solder plating and covering the surfacing metal faces upon melting the solder plating as formed.

Figure 5A:
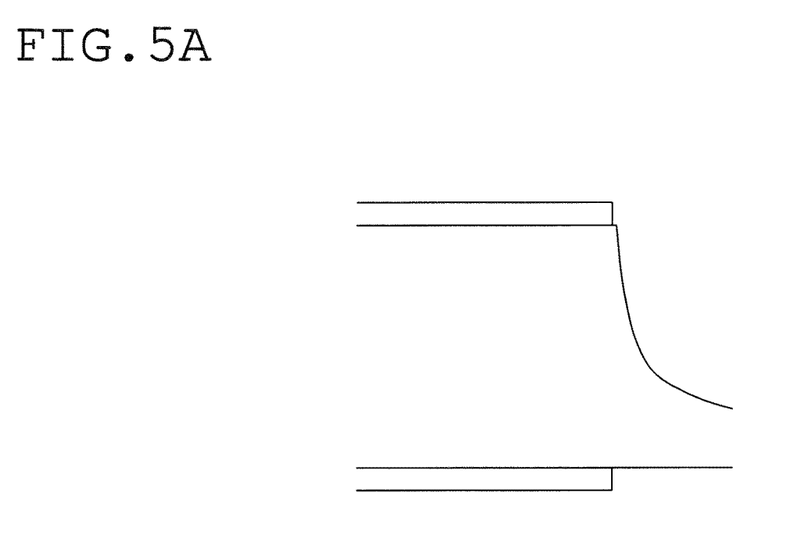
FIG. 5A shows one example.

FIG. 5A shows an example of the shape of each of columnar portions that are to serve as internal connecting terminals, respectively, or internal connecting terminals and pads, respectively, in a lead frame as disclosed in JP KOKAI No. 2001-24135 or JP KOKAI No. 2009-164232.

Japanese Patent Application Laid-Open (KOKAI) No. 2012-146782 proposes forming overhangs by stamping a surface of columnar portions defined by a half-etched concavity.

Japanese Patent No. 5626785 proposes performing a half-etching process upon use of an etching solution that contains an organic compound containing nitrogen having affinity to copper, to form a concavity having a depth of 50 to 100 μm in the vertical direction as well as to form recesses of 10 to 30 μm in horizontal directions on side faces of the concavity, so that overhangs having protruding lengths corresponding to the depths of the recesses on the side faces of the concavity are formed around the upper rims of the concavity.

Figure 5B:
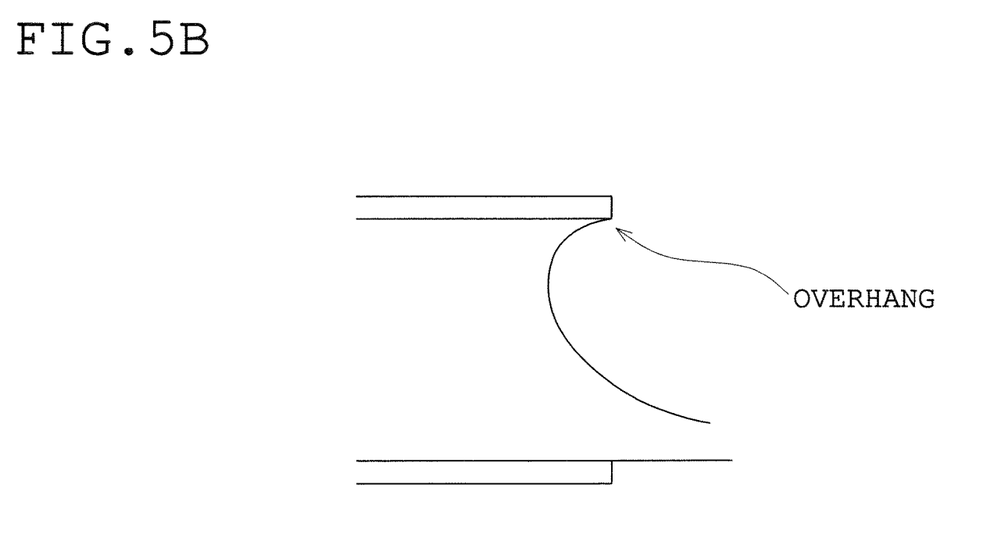
FIG. 5B shows another example.

FIG. 5B shows an example of the shape of each of columnar portions that are to serve as internal connecting terminals, respectively, or internal connecting terminals and pads, respectively, in a lead frame as disclosed in JP KOKAI No. 2012-146782 or JP Patent No. 5626785.

SUMMARY OF THE INVENTION

A lead frame according to some embodiment of the present invention has a concavity formed on the upper surface side of a metal plate, and columnar portions that are defined by the concavity and are to serve as internal connecting terminals, respectively, or internal connecting terminals and pads, respectively, wherein a horizontally deepest portion regarding the side face shape of the concavity is positioned lower than a vertical center position of the concavity.

A method according to an embodiment of the present invention for manufacturing a lead frame includes: forming a plating layer with a predetermined shape on each of the front and back surfaces of a copper plate having a thickness of 100 μm to 200 μm, forming a resist mask covering the plating layer formed on the front-surface side of the copper plate, forming a resist mask covering the entire surface of the copperplate on the back-surface side, and performing half-etching treatment from the front-surface side of the copper plate using an etching solution containing, as an etching inhibitor, an organic compound containing nitrogen having affinity to copper, to form a concavity defining columnar portions that are to serve as internal connecting terminals, respectively, or internal connecting terminals and pads, respectively, such that a horizontally deepest portion thereof is positioned lower than the vertical center position of the concavity, by dissolving and removing the copper plate for 50 to 100 µm in the depth direction thereof so as not to penetrate the entire copper plate.

These and other features of the present invention will become apparent from the following detailed description of the preferred embodiments when taken in conjunction with the accompanying drawings.

BRIEF DESCRIPTION OF THE DRAWINGS

FIGS. 4A-4C are photographs that show cross-sectional shapes of columnar portions defined by concavities of lead frames of embodiment examples of the present invention and a comparative example, respectively, where

FIGS. 5A-5B are diagrams that show cross-sectional shapes of columnar portions defined by concavities of conventional lead frames, where

DETAILED DESCRIPTION OF THE PREFERRED EMBODIMENTS

First, the function and effect of the lead frame and the method for manufacturing the same according to some embodiment of the present invention will be explained.

A lead frame of some embodiment of the present invention has a concavity formed on the upper surface side of a metal plate and columnar portions that are defined by the concavity and are to serve as internal connecting terminals, respectively, or internal connecting terminals and pads, respectively.

The concavity 2 is formed such that a horizontally deepest portion is positioned lower than the vertical center position.

With the concavity being formed such that a horizontally deepest (innermost) portion regarding a side face shape of the concavity defining columnar portions is positioned lower than the vertical center position of the concavity, the top face of each columnar portion protrudes to form an overhang. Also, since the overhang is formed to have a large thickness, defects such as burrs and chipping are rarely generated. In the manufacturing procedure for a package using the lead frame of the present invention, when the semiconductor-element-mounting side of the lead frame is sealed with a resin, the sealing resin is interposed in the concavity to fix the defined individual columnar portions as entering into the horizontally deepest portions regarding the side face shape of the concavity, to thereby enhance capability by the columnar portions of preventing the sealing resin from coming off.

In the lead frame of an embodiment of the present invention, it is preferable that, for the metal plate with a plate thickness of 100 to 200 µm, the depth of the concavity in the vertical direction is 50 to 75% of the plate thickness of the metal plate, and the horizontal distance between a horizontally deepest portion regarding the side face shape of the concavity and a horizontally shallowest portion regarding the side face shape of the concavity is 5 to 30 µm.

Since such a configuration forms overhangs with a large thickness, it is possible to realize a lead frame rarely causing defects such as burrs and chipping and having a capability by the columnar portions of preventing the sealing resin from coming off.

In the lead frame of some embodiment of the present invention, it is preferable that, on the top face of each columnar portion, there is formed a plating layer, around the edge of which on the top face of the columnar portion, the metal plate is left uncovered for 5 to 30 µm.

Such a configuration prevents the metal plate just under the plating layer from being removed by etching, and thus morphologic defects or burr defects of the plating layer formed in the vicinity of overhangs around the top face of the columnar portions are much less likely to be generated.

A method of an embodiment of the present invention for manufacturing a lead frame includes: forming a plating layer with a predetermined shape on each of the front and back surfaces of a copper plate having a thickness of 100 µm to 200 µm, forming a resist mask covering the plating layer formed on the front-surface side of the copper plate, forming a resist mask covering the entire surface of the copper plate on the back-surface side, and performing half-etching treatment from the front-surface side of the copper plate using an etching solution containing, as an etching inhibitor, an organic compound containing nitrogen having affinity to copper, to form a concavity defining columnar portions that are to serve as internal connecting terminals, respectively, or internal connecting terminals and pads, respectively, such that a horizontally deepest portion regarding the side face shape of the concavity is positioned lower than the vertical center position of the concavity, by dissolving and removing the copper plate for 50 to 100 µm in the depth direction thereof so as not to penetrate the entire copper plate.

In the method of an embodiment of the present invention for manufacturing a lead frame, the organic compound containing nitrogen having affinity to copper, which is contained in the etching solution, acts as an etching inhibitor. Etching inhibitors act to inhibit etching in horizontal directions. Therefore, use of the etching solution containing, as an etching inhibitor, an organic compound containing nitrogen having affinity to copper, inhibits etching into the upper portion of side faces of the concavity, which forms columnar portions, and makes it possible to perform the etching process such that the top faces of the columnar portions protrude to form overhangs.

In contrast, although the etching technique using a conventional etching solution makes it possible to form overhangs by increasing the etching amount in the horizontal directions, if an increase of the etching amount in the horizontal directions is intended, the etching process would progress in the vertical direction also as to make through holes in the site that is to undergo half-etching treatment, and would cause, in resin sealing, a failure that the resin leaks from the through holes.

Thus, use of an etching solution containing an etching inhibitor as in the method of an embodiment of the present invention for manufacturing a lead frame makes it possible to form overhangs by increasing the etching amount in the horizontal directions while inhibiting the etching amount in the vertical direction, and is free from the problem of through holes penetrating the site that is to undergo half-etching treatment.

To be specific, in the case of the method according to an embodiment of the present invention for manufacturing a lead frame in which a copper material is used as the metal plate, an organic compound containing nitrogen having affinity to copper is used as the etching inhibitor. The nitrogen compound adsorbed to the copper on the side face around a terminal portion top face as etched inhibits etching into the upper portion of the side face of the columnar portion, to form an overhang.

Specific examples of organic compounds containing nitrogen having affinity to copper include azoles, and azoles having nitrogen atoms alone as heteroatoms in the ring are preferred.

Of the azoles, an imidazole compound, a triazole compound or a tetrazole compound is much desirable.

In this case, it is preferable that the etching solution has a composition with 70 to 110 g/liter of cupric ion, 5 g/liter or less of cuprous ion, 30 to 55 g/liter of hydrochloric acid, and, as an additive, 0.1 to 50 g/liter of a tetrazole compound, for example.

For etching (half-etching) the metal plate, applicable are a method in which the formed plating layer is used as an etching mask and a method in which a resist mask is formed and used.

If the plating layer is used as an etching mask, the steps for forming a resist mask can be omitted, but when the etching amount is increased, the metal plate just under the formed plating layer is etched and the edge of the plating layer may protrude and break, to cause problems such as morphological defects and burr defects.

On the other hand, in the method using a resist mask, although the steps for forming the resist mask are added, a range larger (wider) than the formed plating layer can be masked and thus increasing the etching amount makes it possible to increase the length of an overhang made of the metal plate, which is advantageous for improving the adhesion strength. Further, since forming the plating layer only in the minimum necessary region such as the bonding region suffices, the quantity of metals used for plating can be reduced as compared with the method in which the plating layer is used as the etching mask.

In the method of an embodiment of the present invention for manufacturing a lead frame, the concavity is formed preferably such that the horizontal distance between a horizontally deepest portion regarding the side face shape of the concavity and a horizontally shallowest portion regarding the side face shape of the concavity is 5 μm to 30 μm.

In such a configuration, it is possible to realize a lead frame in which the overhangs, as being formed with a large thickness, rarely cause defects such as burrs and chippings, so that the columnar portions are given an enhanced capability of preventing the sealing resin from coming off.

In the method of an embodiment of the present invention for manufacturing a lead frame, the resist mask covering the plating layer on the front-surface side of the copper plate is preferably formed to leave the copper plate uncovered for 5 μm to 30 mm around the edge of the plating layer on the top face of each columnar portion.

In such a configuration, it is possible to obtain a lead frame in which morphological defects or burr defects of the plating layer formed in the vicinity of overhangs protruding from the top faces of the columnar portions are much less likely to be generated.

Therefore, according to some embodiment of the present invention, it is possible to obtain a lead frame in which morphologic defects or burr defects of overhangs are rarely generated so that the columnar portions are given an enhanced capability of preventing the sealing resin from coming off without sacrificing the freedom of wiring design, and a method for manufacturing the same.

Embodiment 1

Next, an explanation will be made of Embodiment 1 of the present invention.

Figure 1:
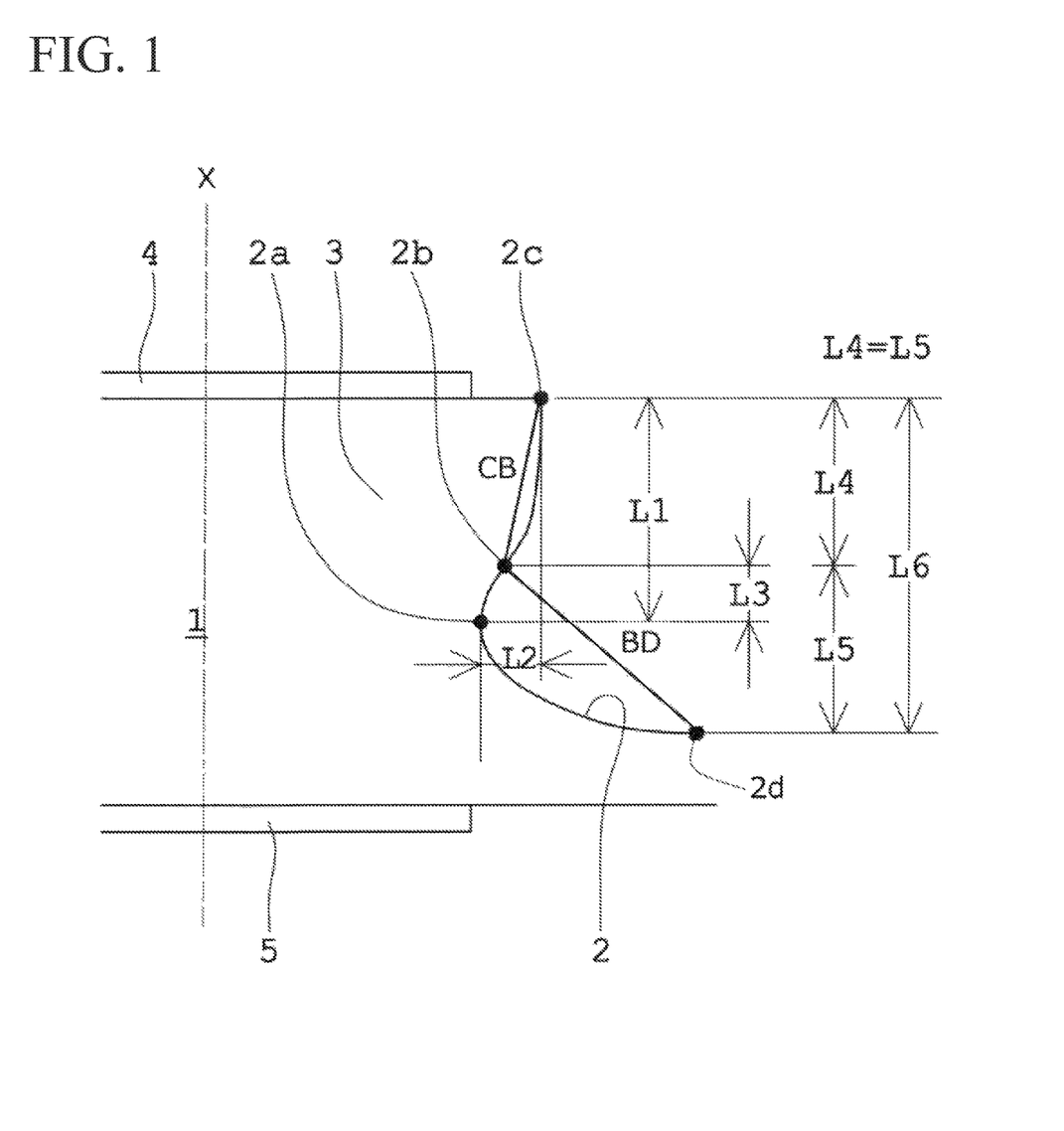
FIG. 1 is a diagram that shows the cross-sectional shape of a columnar portion defined by a concavity of a lead frame according to one embodiment of the present invention.

FIG. 1 is a diagram that shows the cross-sectional shape of a columnar portion defined by a concavity of a lead frame according to one embodiment of the present invention. FIGS. 2A-2D are explanatory diagrams that show a manufacturing procedure for the lead frame according to Embodiment 1 of the present invention.

The lead frame of Embodiment 1 of the present invention has, as shown in FIG. 1, a concavity 2 formed on the upper surface side of a metal plate 1, and columnar portions 3 that are defined by the concavity 2 and are to serve as internal connecting terminals, respectively, or internal connecting terminals and pads, respectively. As illustrated in, e.g., FIGS. 1, 2C, and 2D, the concavity 2 does not extend entirely through the metal plate 1 (i.e., is not a through-hole), and therefore has a bottom.

A horizontally deepest portion (i.e., an innermost portion, or the deepest portion in the horizontal direction) 2a regarding the side face shape of the concavity 2 is positioned lower than a vertical center position 2b of the concavity 2. To be specific, in a region having a vertical depth L6 of the concavity 2, the horizontally deepest portion 2a (the portion of the side wall closest to a vertical center axis X of the respective columnar portion 3) with respect to the side face shape of the concavity 2 is formed within a range of a region L5 lower than the vertical center position. A distance L1 from a top face of the metal plate 1 to the horizontally deepest portion 2a regarding the side face shape of the concavity 2 is longer than a distance L4 from the top face of the metal plate 1 to the vertical center position 2b of the concavity 2 by a distance L3. As shown in FIGS. 1, 2C, and 2D, an upper portion of the side wall of each of the columnar portions 3 (corresponding to the distance L1 in FIG. 1) has a smoothly-curved profile inclined inwardly toward the vertical center axis X (i.e., an axis along the top-bottom direction of FIGS. 1, 2C, and 2D) of the respective columnar portion 3 from the top face (i.e., edge 2c of the upper surface side) of the metal plate 1 to an innermost portion 2a along a horizontal axis of the concavity (i.e., to a portion closest to the vertical center axis X of the respective columnar portion 3). The lower portion of the side wall of each of the columnar portions 3 (corresponding to the distance L6 minus the distance L1 in FIG. 1) then smoothly curves outwardly away from the vertical center axis of the respective columnar portion 3 and extends from the innermost portion 2a to join the bottom (base position 2d) of the adjacent concavity 2. The inward incline is slight (relatively small) at a first section of the upper portion of the side wall of the respective columnar portion 3 at the top edge (i.e., just below the edge 2c of the upper surface side; the upper section of distance L1) and increases (is relatively large) at a second section of the upper portion of the side wall located below the first upper portion (i.e., the lower section of distance L1). Thus, as illustrated in FIG. 1, the upper portion of the profile of the side wall forms a smooth convex curve relative to a straight line segment CB from the edge 2c of the upper surface side of the metal plate to the vertical center position 2b of the concavity 2, and is continuously inclined inwardly toward the vertical center axis X of the respective columnar portion 3 from the edge 2c to the vertical center position 2b. Furthermore, the lower portion of the profile forms a smooth concave curve relative to a straight line segment BD extending from the vertical center position 2b to the base position 2d where the side wall of the respective columnar portion 3 meets the bottom surface of the adjacent concavity 2, with the upper portion and the lower portion linked to form a continuous curve. In addition, the innermost portion 2a of the side wall of the respective column 3 is located lower (i.e., closer to the bottom surface of the concavity 2) than the vertical center position 2b. Thus, the columnar portion 3 is formed to have a relatively thick overhang portion above the innermost portion 2c of the concavity.

For the metal plate 1 with a plate thickness of 100 μm to 200 μm, the concavity 2 is formed such that the depth L6 of the concavity 2 in the vertical direction is 50 to 75% of the plate thickness of the metal plate 1, and such that a horizontal distance between the horizontally deepest portion 2a regarding the side face shape of the concavity 2 and a horizontally shallowest portion 2c regarding the side face shape of the concavity 2 is within a range of 5 μm to 30 μm.

Also, at positions corresponding to external connecting terminals on the lower-surface side of the metal plate 1, a plating layer 5 is formed.

The lead frame thus configured can be manufactured, for example, as follows. A description of pre-treatment and post-treatment including chemical cleaning, aqueous washing and the like carried out in each step of the manufacturing is omitted for convenience sake.

First, the metal plate 1 is prepared. As the metal plate 1, a copper material is used. Regarding the copper material, those having high strength as used for normal lead frames are desirable, and the thickness is selected usually within the range of 100 μm to 200 μm in consideration of handling etc.

Then, dry film resists are made to laminate both surfaces of the copper material. While the kind and thickness of the dry film resists are not particularly limited, negative-type ones, in which exposed portions are hardened, are usually used. Alternatively, positive dry film resists may be used. Applying liquidus photoresist may work, also. While the thickness of resist is chosen depending on the line width and interline spacing of the pattern to be formed, those having a thickness of 15 μm to 40 μm are usually used.

Then, each dry film resist is exposed in accordance with a pattern for forming a plating layer having a predetermined shape at a predetermined position. This is the same as the general method, in which, upon a photomask that carries a pattern being brought into tight contact with a dry film resist, the dry film resist is exposed in accordance with the pattern of the photomask by irradiation with ultraviolet rays. The dosage is about 20 mJ/cm2 to 100 mJ/cm2. Through this step, the front-surface side, where to mount a semiconductor element, is distinguished from the opposite, back-surface side, where to form external connecting terminals.

Then, development is conducted, to thereby form, on both the surfaces of the copper material, resist masks 6 for plating having openings of predetermined shape.

In the case where alkali-developable photoresist is used, sodium carbonate at a concentration of about 1% is usually used.

Figure 2A:
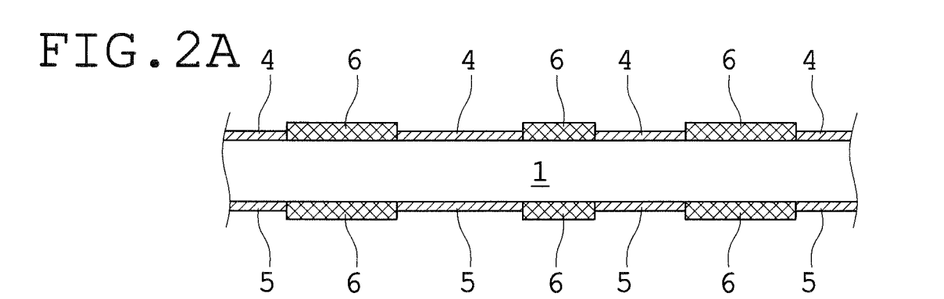
FIGS. 2A-2D are explanatory diagrams that show a manufacturing procedure for the lead frame according to one embodiment of the present invention.

Then, the openings in the resist masks 6 for plating are plated (See FIG. 2A). The metals to be used for plating are appropriately selected in consideration of heat resistance, wire bondability for connection with a semiconductor element, solder wettability in mounting on a printed circuit board, and the like. Normally, Ni, Pd, Au, Ag and the like are used for plating via electroplating.

After that, the resist masks 6 for plating are peeled off. In the case where alkali-developable photoresist is used, sodium hydroxide at a concentration of about 1% is usually used for peeling.

Figure 2B:
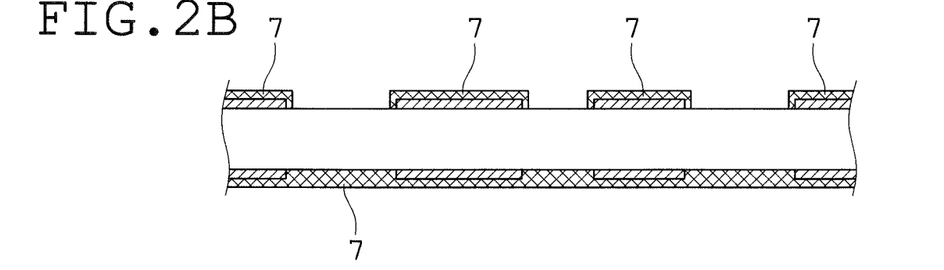
Figure 2C:
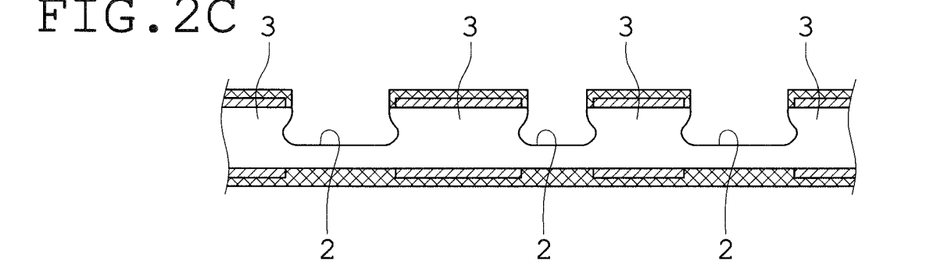
Figure 2D:
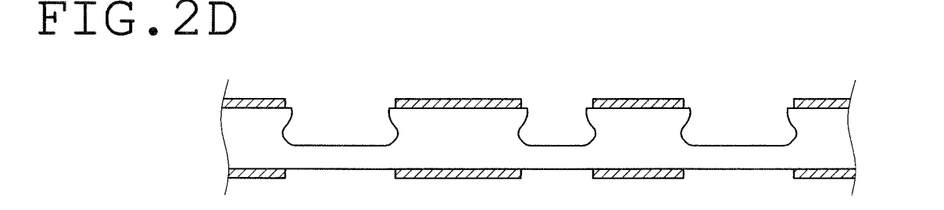

Then, on the front-surface side, a resist mask 7 for etching larger than the formed plating layer is formed in consideration of etching amount and positional deviation in exposure so that burrs of the plating layer should not be formed after half-etching treatment, and a resist mask 7 for etching that covers the entire surface is formed on the back-surface side (see FIG. 2B). This method is the same as laminating, exposure and development as described above.

Then, half-etching is performed via openings in the front-surface side resist mask 7, to form a concavity 2 that defines columnar portions 3 (see FIG. 2C).

Regarding the etching solution, one containing an etching inhibitor is used. Thereby, etching process progresses from the front surface of the copper material with the etching inhibitor being adsorbed to the upper-surface side of the concavity 2 to be formed to inhibit etching on the upper side of the concavity 2 (in the vicinity of the front surface of the copper material), so that the concavity 2 is formed with the horizontally deepest portion 2a regarding the side face shape of the concavity 2 is positioned lower than the vertical center position 2b in the concavity 2. As a result, overhangs are produced in the columnar portions 3.

As the etching inhibitor, for example, imidazole compounds, triazole compounds and tetrazole compounds are applicable.

As the etching solution, there can be used, for example, a solution containing 1 g/liter of cuprous concentration, 95 g/liter of cupric concentration, and 45 g/liter of hydrochloric acid, to which, as the etching inhibitor, 3.3 to 3.6 g/liter of 5-methyl-1H-tetrazole is added.

A deep half-etching is preferable in that the amount of etching process to be performed later is small. However, since half-etching too deeply detracts from the strength of the lead frame and causes defects such as generation of through holes, it is desirable to carry out half etching so that the copper material remains at least about 30 μm in thickness and has a bottom, as noted above. Further, the concavity 2 formed by half etching is shaped such that the vertical depth L6 is 50 to 75% of the plate thickness of the copper material and the horizontal distance L2 between the horizontally deepest portion 2a regarding the side face shape of the concavity 2 and the horizontally shallowest portion 2c regarding the side face shape of the concavity 2 is 5 μm to 30 μm.

Then, the resist masks are removed (see FIG. 2D). Thereby, a lead frame of one embodiment of the present invention provided with the configuration shown in FIG. 1 is attained.

Figure 3A:
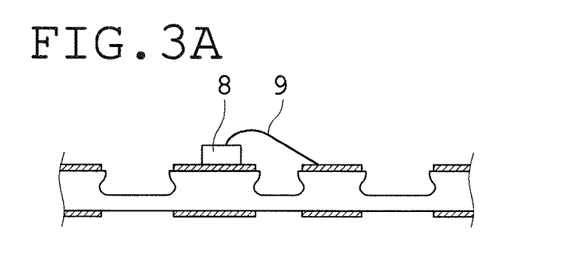
FIGS. 3A-3F are explanatory diagrams that show a manufacturing procedure for a package upon use of the lead frame according to one embodiment of the present invention.

Then, semiconductor elements 8 are mounted on the pads (plating layer) 4 on the front-surface side of the attained lead frame by use of die paste or the like, and the semiconductor elements and the internal connecting terminals are wire-bonded via wires 9 (See FIG. 3A). As the die paste, silver paste is used, and wires such as gold wires and copper wires with a size of 20 µmφ to 40 µmφ are used for wire-bonding.

Figure 3B:
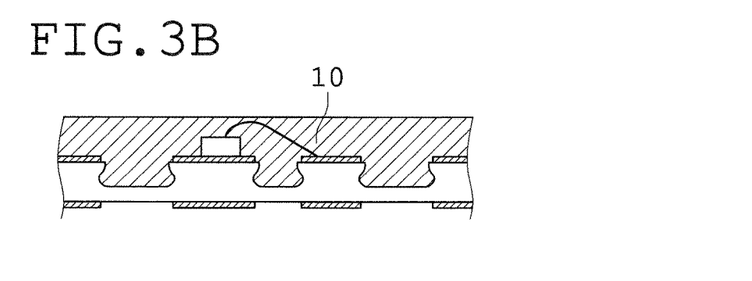
Figure 3C:
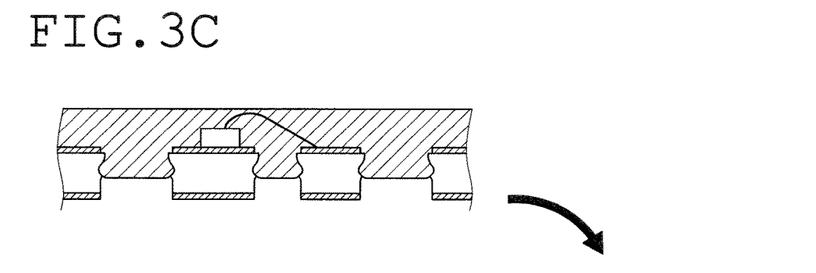

Then, the semiconductor-element-mounting side of the copper material is resin-sealed with an epoxy resin or the like. The sealing resin 10 formed thereby is interposed in the concavity 2 of the lead frame as entering into the horizontally deepest portions 2a of the concavity, to fix the defined individual columnar portions 3 (see FIG. 3B).

Figure 3D:
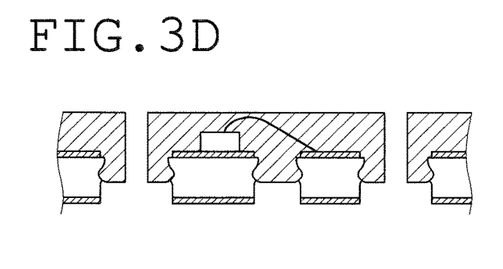
Figure 3E:
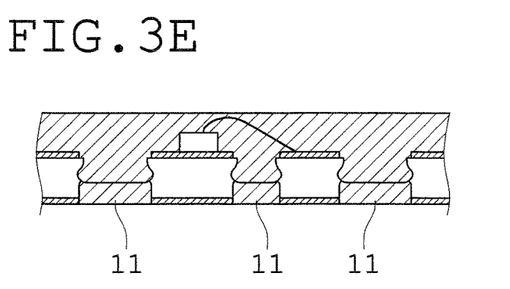
Figure 3F:
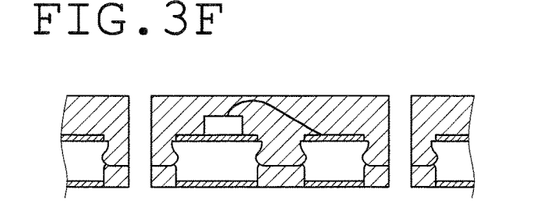

Then, the copper material is etched upon use of the plating layer 5 formed on the back-surface side as an etching mask, to make the semiconductor-element-mounting portions (pads) and the terminal portions (internal connecting terminals and external connecting terminals) independent. Then, the entirety is cut into individual package-sized pieces by a method such as dicing (see FIG. 3D). It is noted that a reinforcing resin 11 may be made to fill a concavity on the back-surface side, for reinforcing, as being integral with the sealing resin 10, the fixation of the columnar portions 3 before cutting into the individual package-sized pieces (see FIG. 3E, FIG. 3F).

In this way, packages are obtained.

In the lead frame of Embodiment 1 of the present invention, a boundary portion of the surface of the metal plate 1 can be left uncovered for a width of 5 µm to 30 µm around the edge of the plating layer on the top face of each columnar portion 3. Such a lead frame can be obtained, for example in the manufacturing procedure for the lead frame, by forming a resist mask larger by 20 µm to 50 µm than the plating layer 4 formed on the upper surface of the copper plate and performing half-etching to thereby form the columnar portions 3, for leaving the surface of the copper plate uncovered for 5 µm to 30 µm outside the plating layer 4 on the top faces.

According to the lead frame of Embodiment 1 of the present invention, since the concavity 2 is formed such that the innermost portion 2a regarding a side face shape of the concavity 2 defining the columnar portions 3 is positioned lower than the vertical center position 2b of the concavity 2, the top face of each columnar portion 3 protrudes to form an overhang. Also, since the overhang is formed to have a large thickness, defects such as burrs and chipping are rarely generated. In the manufacturing procedure for a package using the lead frame of one embodiment of the present invention, when the semiconductor-element-mounting side of the lead frame is sealed with a resin, the sealing resin 10 is interposed in the concavity 2 to fix the defined individual columnar portions 3 by entering into the innermost portions 2a regarding the side face shape of the concavity. Therefore, the capability of preventing the columnar portions 3 from coming off the sealing resin 10 is enhanced.

According to the lead frame of Embodiment 1 of the present invention, for the metal plate 1 with a plate thickness of 100 µm to 200 µm, the depth L6 of the concavity 2 in the vertical direction is 50 to 75% of the plate thickness of the metal plate 1, and the horizontal distance between the innermost portion 2a regarding the side face shape of the concavity 2 and the horizontally shallowest portion 2c regarding the side face shape of the concavity 2 is 5 µm to 30 µm. Therefore, the overhangs are formed to have a large thickness. Therefore, it is possible to realize a lead frame rarely causing defects such as burrs and chipping and having a capability of preventing the columnar portions 3 from coming off the sealing resin 10.

According to the lead frame of Embodiment 1 of the present invention, on the top face of each columnar portion 3, there is formed a plating layer 4, around the edge of which on the top face of the columnar portion 3, the metal plate 1 is left uncovered for 5 µm to 30 µm. Therefore, the metal plate 1 just under the plating layer is prevented from being removed by etching, and thus morphologic defects or burr defects of the plating layer 4 formed in the vicinity of overhangs around the top face of the columnar portions 3 are much less likely to be generated.

EXAMPLES

Hereafter, an explanation will be made of lead frames that were actually fabricated based on Embodiment 1 of the present invention, as examples.

First, a copper-based alloy material with a thickness of 0.125 mm was used as the metal plate 1, both sides of which were laminated with a dry film resist.

Then, the both sides were exposed in a predetermined pattern and developed, to form resist masks 6 for plating having openings in sites where plating was necessary.

Then, plating with Ni, Pd, and Au was sequentially performed by electroplating through the openings in the resist masks 6, to form the plating layer 4 (see FIG. 2A).

Then, the resist masks 6 for plating were peeled off, the same dry film resist as used before was made to laminate the both surfaces of the metal plate 1 on which the plating layer 4 had been formed, and, on the front-surface side where to mount a semiconductor element 8, exposure and development were made with a pattern larger than the formed plating layer 4 by 50 µm, to form a resist mask 7 that was larger than the plating layer 4 by 50 µm. On the opposite, back-surface side, a resist mask 7 that masked the entire surface was formed (see FIG. 2B).

Then, upon use of an etching solution having the solution temperature of 40° C. and containing 1 g/liter of cuprous concentration, 95 g/liter of cupric concentration, and 45 g/liter of hydrochloric acid, to which, as an etching inhibitor, 3.3 to 3.6 g/liter of 5-methyl-1H-tetrazole was added, half-etching was performed at the spraying pressure of 0.09 to 0.13 MPa for 4 minutes from the front-surface side to the depth of about 80 µm, to form a concavity 2 defining columnar portions 3 so that the innermost portion 2a regarding the side face shape of the concavity 2 was positioned lower than the vertical center position 2b of the concavity 2 (see FIG. 2C).

Thereafter, the resist masks on both sides were peeled off, so that the lead frame of each of Examples 1 to 6 was obtained (see FIG. 2D).

The distance L2 from the horizontally shallowest portion 2c of the concavity 2, which was formed by side etching during the half-etching treatment and defined the columnar portions 3, to the innermost portion 2a of the concavity 2 in each of the lead frames of Examples 1 to 6 thus obtained was 6 µm to 18 µm.

Figure 4A:
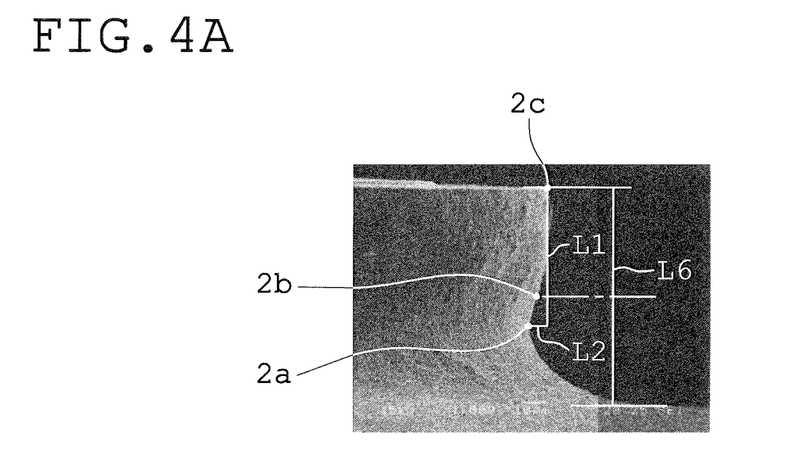
FIG. 4A is a picture of a columnar portion of a lead frame according to one embodiment example of the present invention.
Figure 4B:
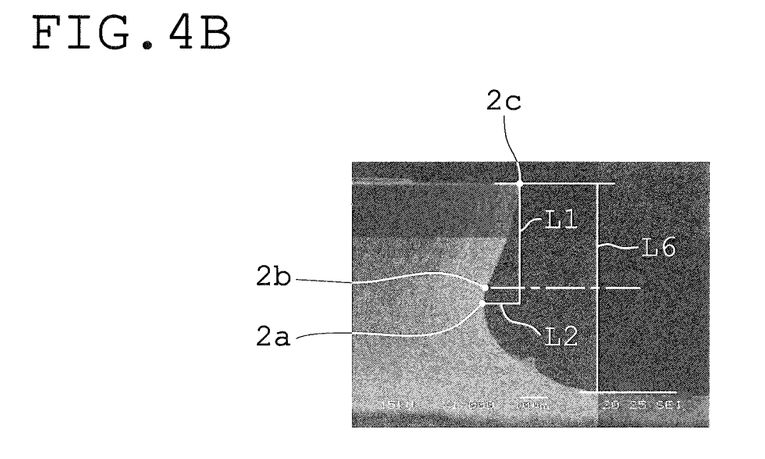
FIG. 4B is a picture of a columnar portion of a lead frame according to another embodiment example.

As examples of the cross sectional shape of a columnar portion defined by the concavity of the lead frame of examples of the present invention, the cross-sectional shapes of the columnar portions defined by the concavity of the lead frames according to Example 2 and Example 6 are shown by pictures in FIG. 4A and FIG. 4B, respectively.

Comparative Example

As comparative examples, each lead frame was manufactured upon use of the same material of the resist masks as stated before, but in the etching process, half-etching was performed upon use of an etching solution having the solution temperature of 40° C. and containing 1 g/liter of cuprous concentration, 95 g/liter of cupric concentration, and 45 g/liter of hydrochloric acid, to which, as an etching inhibitor, 2.7 to 3.0 g/liter (Comparative Examples 1 to 6) or 3.9 g/liter (Reference Examples 7 to 9) of 5-methyl-1H-tetrazole was added, at the spraying pressure of 0.09 to 0.13 MPa for 4 minutes from the front-surface side to the depth of about 80 μm, to form the concavity 2 defining the columnar portions 3 so that the horizontally deepest portion (innermost portion) 2a regarding the side face shape of the concavity 2 was positioned higher than the vertical center position 2b of the concavity 2.

The distance L2 from the horizontally shallowest portion 2c of the concavity 2, which was formed by side etching during the half-etching treatment and defined the columnar portions 3, to the innermost portion 2a of the concavity 2 in each of the lead frames of Examples 1 to 6 was 10 μm to 24 μm. Also, regarding the lead frames of Comparative Examples 7 to 9, which were formed upon 3.9 g/liter of the etching inhibitor being added, the side face shape of the concavity was broken and thus the position of the innermost portion 2a regarding the side face shape of the concavity could not be measured.

Figure 4C:
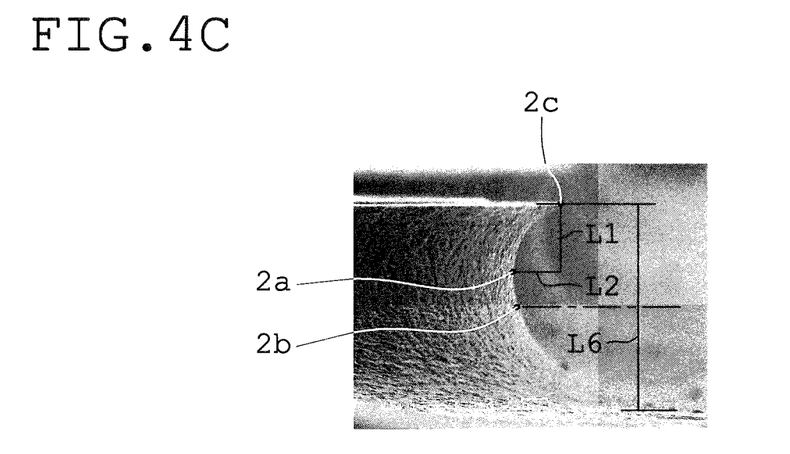
FIG. 4C is a picture of a columnar portion of a lead frame according to one comparative example.

As an example of the cross sectional shape of a columnar portion defined by the concavity of the lead frame of the comparative examples of the present invention, the cross-sectional shape of a columnar portion defined by the concavity of the lead frame according to Comparative Example 2 is shown by a picture in FIG. 4C.

Etching solution, concentration of etching inhibitor, and spraying pressure applied in manufacturing the lead frames of Examples 1 to 6 and Comparative Examples 1 to 9, and etched dimensions of the lead frames as manufactured are shown in Table 1.

In Table 1, L1 denotes a distance from the upper surface of the metal plate 1 to the horizontally deepest portion (innermost portion) 2a regarding the side face shape of the concavity 2 (L1 also indicates the upper portion of the side wall of each of the columnar portions 3), L2 denotes a distance from the horizontally shallowest portion 2c of the concavity 2 to the horizontally deepest portion 2a of the concavity 2, L3 denotes a difference between the distance L1 from the upper surface of the metal plate 1 to the horizontally deepest portion (innermost portion) 2a regarding side face shape of the concavity 2 and the distance L4 from the upper surface of the metal plate 1 to the vertical center position 2 in the concavity 2, and L6 is a vertical depth of the concavity 2.

TABLE 1

| | Etching Solution | Concentration of Etching Inhibitor (g/L) | Spraying Pressure (MPa) | Etched Dimensions (mm) | | | |
|---|---|---|---|---|---|---|---|
| | | | | L6 | L1 | L2 | L3 |
| Comparative Example 1 | Copper Chloride Solution | 2.7 | 0.09 | 0.0606 | 0.0222 | 0.0238 | −0.0081 |
| Comparative Example 2 | Copper Chloride Solution | 2.7 | 0.11 | 0.0764 | 0.0271 | 0.0173 | −0.0111 |
| Comparative Example 3 | Copper Chloride Solution | 2.7 | 0.13 | 0.0769 | 0.0151 | 0.0103 | −0.0234 |
| Comparative Example 4 | Copper Chloride Solution | 3.0 | 0.09 | 0.0809 | 0.0351 | 0.0177 | 0.0054 |
| Comparative Example 5 | Copper Chloride Solution | 3.0 | 0.11 | 0.0800 | 0.0356 | 0.0167 | −0.0044 |
| Comparative Example 6 | Copper Chloride Solution | 3.0 | 0.13 | 0.0805 | 0.0356 | 0.0222 | −0.0047 |
| Embodiment Example 1 | Copper Chloride Solution | 3.3 | 0.09 | 0.0761 | 0.0410 | 0.0111 | 0.0030 |
| Embodiment Example 2 | Copper Chloride Solution | 3.3 | 0.11 | 0.0784 | 0.0423 | 0.0133 | 0.0031 |
| Embodiment Example 3 | Copper Chloride Solution | 3.3 | 0.13 | 0.0796 | 0.0423 | 0.0179 | 0.0025 |
| Embodiment Example 4 | Copper Chloride Solution | 3.6 | 0.09 | 0.0719 | 0.0479 | 0.0076 | 0.0120 |
| Embodiment Example 5 | Copper Chloride Solution | 3.6 | 0.11 | 0.0786 | 0.0472 | 0.0060 | 0.0079 |
| Embodiment Example 6 | Copper Chloride Solution | 3.6 | 0.13 | 0.0800 | 0.0488 | 0.0083 | 0.0088 |
| Comparative Example 7 | Copper Chloride Solution | 3.9 | 0.09 | — | — | — | |
| Comparative Example 8 | Copper Chloride Solution | 3.9 | 0.11 | — | — | — | |

TABLE 1-continued

| | Etching Solution | Concentration of Etching Inhibitor (g/L) | Spraying Pressure (MPa) | Etched Dimensions (mm) | | | |
|---|---|---|---|---|---|---|---|
| | | | | L6 | L1 | L2 | L3 |
| Comparative Example 9 | Copper Chloride Solution | 3.9 | 0.13 | — | — | — | — |

Evaluation of Shape Forming Stability of Horizontally Shallowest Portion Regarding Side Face Shape 1000 test samples of Examples 1 to 6 and Comparative Examples 1 to 6 shown in Table 1 were prepared for evaluating in a simple manner the shape forming stability of the horizontally shallowest portion 2c regarding the side face shape of the columnar portion 3. In the 1000 test samples for each example, the number of chipping defects at the horizontally shallowest portion regarding the side face shape of the columnar portion 3 was counted, and the rate of chipping defect was calculated.

Table 2 shows the evaluation results of the shape forming stability of the horizontally shallowest portion 2c regarding the side face shape of the columnar portion 3 of the test samples of the lead frames of Embodiment Examples 1 to 6 and Comparative Examples 1 to 6.

TABLE 2

| | Number of Inspected Samples | Chipping Defects | Detection Rate of Chipping Defects at Horizontally Shallowest Portion 2c (%) |
|---|---|---|---|
| Embodiment Example 1 | 1000 | 0 | 0 |
| Embodiment Example 2 | 1000 | 0 | 0 |
| Embodiment Example 3 | 1000 | 0 | 0 |
| Embodiment Example 4 | 1000 | 0 | 0 |
| Embodiment Example 5 | 1000 | 0 | 0 |
| Embodiment Example 6 | 1000 | 0 | 0 |
| Comparative Example 1 | 1000 | 8 | 0.8 |
| Comparative 0Example 2 | 1000 | 7 | 0.7 |
| Comparative Example 3 | 1000 | 13 | 1.3 |
| Comparative Example 4 | 1000 | 3 | 0.3 |
| Comparative Example 5 | 1000 | 3 | 0.3 |
| Comparative Example 6 | 1000 | 2 | 0.2 |

In the test samples of the lead frames of Examples 1 to 6, chipping defects at the horizontally shallowest portion 2c in the side face shape of the columnar portion 3 were not detected at all. On the other hand, in the test samples of the lead frames of Comparative Examples 1 to 6, the chipping defects at the horizontally shallowest portion 2c regarding the side face shape of the columnar portion 3 were detected in the range of 0.2% to 1.3%.

What is claimed is:

1. A lead frame comprising:
a metal plate having:
concavities on an upper surface side thereof, each of the concavities extending partially through the metal plate so as to have a bottom, and
columnar portions defined by the concavities and forming internal connecting terminals,
wherein a side wall of each of the columnar portions has, in a cross-sectional view taken through a diameter of a respective one of the columnar portions, a profile consisting of an upper portion extending from an edge of the upper surface side of the metal plate to a vertical center position, the vertical center position being located at half of a depth of an adjacent respective one of the concavities, and a lower portion extending from the vertical center position to a base position where the side wall meets the bottom of the adjacent respective one of the concavities, the upper portion of the profile of the side wall forming a smooth convex curve relative to a straight line segment extending from the edge of the upper surface side of the metal plate to the vertical center position and being continuously inclined inwardly toward a vertical center axis of the respective one of the columnar portions from the edge of the upper surface side of the metal plate to the vertical center position, and the lower portion of the profile of the side wall forming a smooth concave curve relative to a straight line segment extending from the vertical center position to the base position, the upper portion and the lower portion of the profile being joined to form a continuous curve, and
wherein an innermost portion of the profile of the side wall of the respective one of the columnar portions is a portion of the profile located closest to the vertical center axis of the respective one of the columnar portions, the innermost portion of the profile of the side wall of the respective one of the columnar portions being positioned lower than the vertical center position of the profile of the side wall of the respective one of the columnar portions such that respective one of the columnar portions has an overhang.

2. The lead frame according to claim 1, wherein the metal plate has a plate thickness of 100 μm to 200 μm, and the depth of the concavities in a vertical direction is in a range of 50% to 75% of the plate thickness of the metal plate, and the side wall of each of the columnar portions is formed such that a horizontal distance between the innermost portion and a vertical line extending from the edge of the upper surface side of the metal plate is in a range of 5 μm to 30 μm.

3. The lead frame according to claim 1, further comprising a plating layer on the upper surface side of each of the columnar portions, and
wherein the plating layer is formed such that a boundary portion of the upper surface side of the metal plate between an edge of the plating layer and the edge of the upper surface side of the metal plate of each of the columnar portions is left uncovered, the boundary portion having a width in a range of 5 μm to 30 μm.

4. The lead frame of claim 1, wherein the concavities are arranged such that at least one of the columnar portions forms a pad.

5. The lead frame of claim 1, wherein an average incline of a first section of the upper portion of the side wall of each of the columnar portions is less than an average incline of a second section of the upper portion of the side wall of each of the columnar portions, the first section of the upper portion being located directly below and adjacent to the edge of the upper surface side of the metal plate, and the second section of the upper portion being located directly below and adjacent to the first section of the upper portion.

* * * * *